(12) United States Patent
Lee (10) Patent No.: US 8,145,866 B2
(45) Date of Patent: Mar. 27, 2012

(54) SELECTIVE REGISTER RESET

(75) Inventor: June Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 969 days.

(21) Appl. No.: 12/127,365

(22) Filed: May 27, 2008

(65) Prior Publication Data

US 2009/0300311 A1     Dec. 3, 2009

(51) Int. Cl.
*G06F 13/28*     (2006.01)
(52) U.S. Cl. .................. 711/166; 711/E12.001
(58) Field of Classification Search .................. 711/166, 711/E12.001; 710/108, 100, 240; 365/230.03, 365/191
See application file for complete search history.

(56) References Cited

U.S. PATENT DOCUMENTS

| | | | |
|---|---|---|---|
| 6,247,084 B1 * | 6/2001 | Apostol et al. ................ | 710/108 |
| 7,272,694 B2 | 9/2007 | De Santis et al. | |
| 7,280,398 B1 | 10/2007 | Lee | |
| 7,292,487 B1 | 11/2007 | Gatzemeier et al. | |
| 2007/0268775 A1 * | 11/2007 | Han ............................ | 365/233 |
| 2008/0144376 A1 * | 6/2008 | Lee ......................... | 365/185.05 |

OTHER PUBLICATIONS

Cooke, Jim, Flash Memory 101: An introduction to NAND flash, Mobile Handset Designline, Mar. 20, 2006, www.mobilehandsetdesignline.com. (accessed May 5, 2008).
Cooke, Jim, Flash Memory Technology Direction, Microsoft WinHEC Conference 2007, May 2, 2007.
Micron Technology, Inc., Technical Note 29-25: Improving NAND Flash Performance Using Two-Plane Command Enabled Micron Devices, Jun. 2007.
Micron Technology, Inc., Technical Note 29-14: NAND Flash Performance Increase with Program Page Cache Mode Command, May, 2007.
Micron Technology, Inc., Technical Note 29-01: NAND Flash Performance Using the Micron Page Read Cache Mode Command, May, 2007.
Micron Technology, Inc., Technical Note 29-26: NAND Flash Status Register Response in Cache Programming Operations, 2007.
ST Microelectronics, Application Note 1727: How to Use the Cache Program Feature of NAND Flash Memories, May 2004.

* cited by examiner

*Primary Examiner* — Vu Le
(74) *Attorney, Agent, or Firm* — Brooks, Cameron & Huebsch PLLC (57) ABSTRACT

The present disclosure includes methods, devices, modules, and systems for storing selective register reset. One method embodiment includes receiving an indication of a die and a plane associated with at least one address cycle. Such a method can also include selectively resetting a particular register of a number of registers, the particular register corresponding to the plane and the die.

25 Claims, 8 Drawing Sheets

SELECTIVE REGISTER RESET

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory, among others.

Flash memory devices are utilized as non-volatile memory for a wide range of electronic applications. Flash memory devices typically use a one-transistor memory cell that allows for high memory densities, high reliability, and low power consumption.

Uses for flash memory include memory for personal computers, personal digital assistants (PDAs), digital cameras, and cellular telephones. Program code and system data, such as a basic input/output system (BIOS), are typically stored in flash memory devices. This information can be used in personal computer systems, among others.

Two common types of flash memory array architectures are the "NAND" and "NOR" architectures, so called for the logical form in which the basic memory cell configuration of each is arranged.

A NAND array architecture arranges its array of floating gate memory cells in a matrix such that the gates of each floating gate memory cell in a "row" of the array are coupled to an access line, which is commonly referred to in the art as a "word line". However each memory cell is not directly coupled to a sense line (which is commonly referred to as a digit line, e.g., a bit line, in the art) by its drain. Instead, the memory cells of the array are coupled together in series, source to drain, between a source line and a sense line, where the memory cells commonly coupled to a particular sense line are referred to as a "column".

Memory cells in a NAND array architecture can be programmed to a desired state. That is, electric charge can be placed on or removed from the floating gate of a memory cell to put the cell into a number of programmed states. For example, a single level cell (SLC) can represent two states, e.g., 1 or 0. Flash memory cells can also store more than two states, e.g., 1111, 0111, 0011, 1011, 1001, 0001, 0101, 1101, 1100, 0100, 0000, 1000, 1010, 0010, 0110, and 1110. Such cells may be referred to as multi state memory cells, multi-digit cells, or multilevel cells (MLCs). MLCs can allow the manufacture of higher density memories without increasing the number of memory cells since each cell can represent more than one digit, e.g., more than one bit. MLCs can have more than two programmed states, e.g., a cell capable of representing four digits can have sixteen programmed states. For some MLCs, one of the sixteen programmed states can be an erased state. For these MLCs, the lowermost program state is not programmed above the erased state, that is, if the cell is programmed to the lowermost state, it remains in the erased state rather than having a charge applied to the cell during a programming operation. The other fifteen states can be referred to as "non-erased" states.

Flash memory devices can be programmed with various amounts of data at one time. The amount of data programmable at one time can be referred to as a page of data (wherein the cells storing the page of data can be referred to as a page of memory cells). In some memory devices, one page of data includes data stored on memory cells coupled to a given access line (which may be one and the same as the conductor that forms the control gate of the cell). In other memory devices, data stored on an access line can be divided into more than one page, e.g., into an "even" page and "odd" page of data. In some instances, a page of data may include data stored in memory cells coupled to more than one access line. Various amounts of data can also be erased from a flash device at the same time. The amount of data erasable at one time can be referred to as a block of data (wherein the cells corresponding to the block of data can be referred to as a block of memory cells). A block of data can include a number of data pages. A memory plane can include a number of data blocks on a given die (wherein a plane can therefore also refer to the memory cells that correspond to the data blocks). Some memory devices have multiple planes per die. For example, a die could include a plane of even numbered blocks and a plane of odd numbered blocks.

During a programming operation, data can be loaded into registers for each memory plane before being programmed to each plane. For example, a page of data may be loaded into a register, then programmed to a plane, after which another page of data may be loaded into the register. This process can repeat until the programming operation completes. During a sensing operation, data can be loaded from one or more memory planes into registers.

DETAILED DESCRIPTION

The present disclosure includes methods, devices, modules, and systems for storing selective register reset. One method embodiment includes receiving an indication of a die and a plane associated with at least one address cycle. Such a method also includes selectively resetting a particular register of a number of registers, the particular register corresponding to the plane and the die.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M," particularly with respect to reference numerals in the drawings, indicate that a number of the particular feature so designated can be included with one or more embodiments of the present disclosure.

Figure 1:
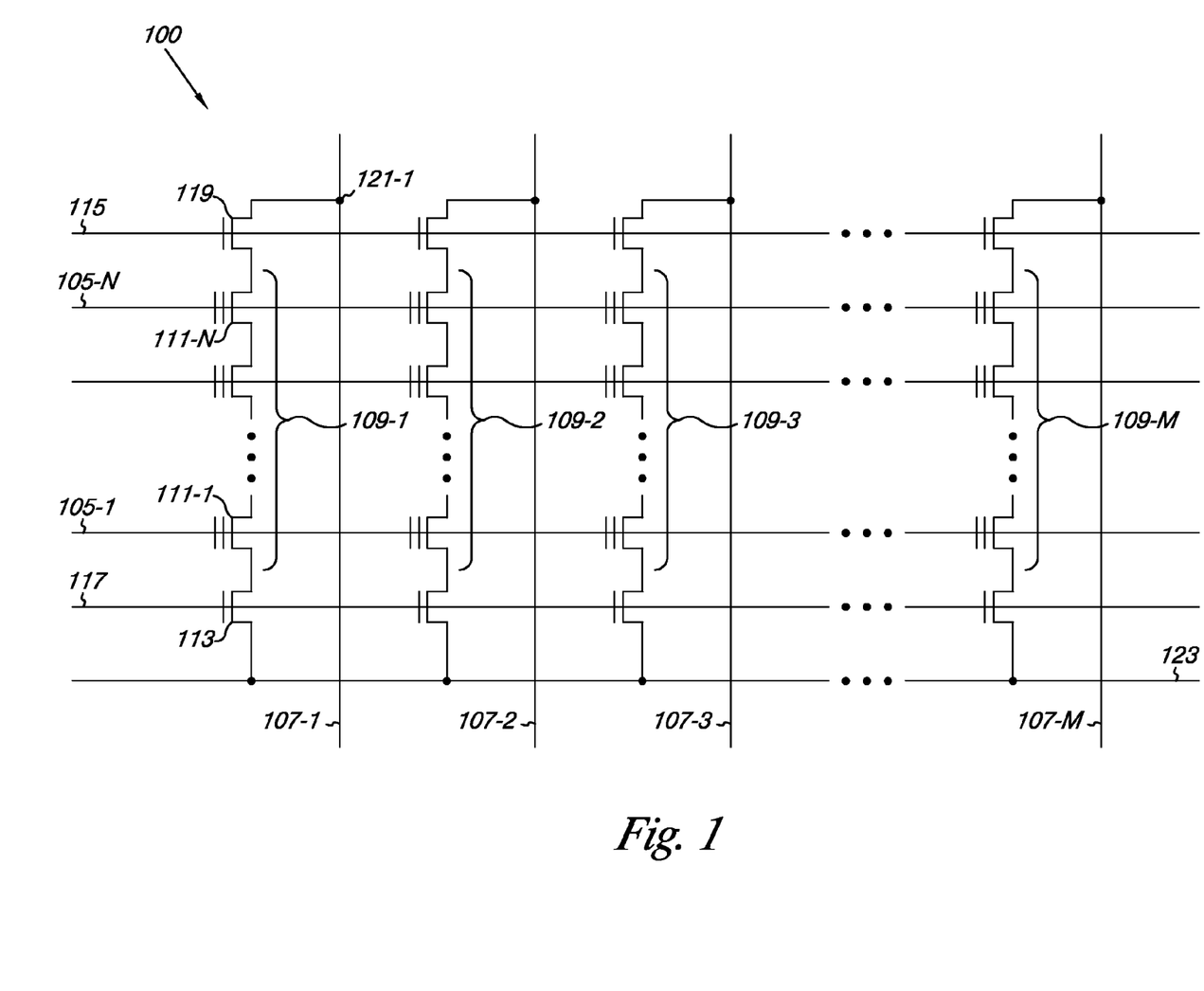
FIG. 1 is a schematic of a portion of a non-volatile memory array in accordance with one or more embodiments of the present disclosure.

FIG. 1 is a schematic of a portion of a non-volatile memory array 100. The embodiment of FIG. 1 illustrates a NAND architecture non-volatile memory. However, embodiments described herein are not limited to this example. As shown in FIG. 1, the memory array 100 includes access lines 105-1, . . . , 105-N and intersecting sense lines 107-1, . . . , 107-M. For ease of addressing in the digital environment, the number of access lines 105-1, . . . , 105-N and the number of sense lines 107-1, . . . , 107-M are each some power of two, e.g., 256 access lines by 4,096 sense lines.

Memory array 100 includes NAND strings 109-1, . . . , 109-M. Each NAND string includes non-volatile memory cells 111-1, . . . , 111-N, each located at an intersection of an access line 105-1, . . . , 105-N and a local sense line 107-1, . . . , 107-M. The non-volatile memory cells 111-1, . . . , 111-N of each NAND string 109-1, . . . , 109-M are connected in series source to drain between a source select gate (SGS), e.g., a field-effect transistor (FET) 113, and a drain select gate (SGD), e.g., FET 119. Source select gate 113 is located at the intersection of a local sense line 107-1 and a source select line 117 while drain select gate 119 is located at the intersection of a local sense line 107-1 and a drain select line 115.

As shown in the embodiment illustrated in FIG. 1, a source of source select gate 113 is connected to a common source line 123. The drain of source select gate 113 is connected to the source of the memory cell 111-1 of the corresponding NAND string 109-1. The drain of drain select gate 119 is connected to the local sense line 107-1 for the corresponding NAND string 109-1 at drain contact 121-1. The source of drain select gate 119 is connected to the drain of the last memory cell 111-N, e.g., a floating-gate transistor, of the corresponding NAND string 109-1.

In one or more embodiments, construction of non-volatile memory cells, 111-1, . . . , 111-N, includes a source, a drain, a floating gate or other charge storage node, and a control gate. Non-volatile memory cells, 111-1, . . . , 111-N, have their control gates coupled to an access line, 105-1, . . . , 105-N respectively. A column of the non-volatile memory cells, 111-1, . . . , 111-N, make up the NAND strings, e.g., 109-1, . . . , 109-M, and are coupled to a given local sense line, e.g., 107-1, . . . , 107-M respectively. A row of the non-volatile memory cells are those memory cells commonly coupled to a given access line, e.g., 105-1, . . . , 105-N. A NOR array architecture would be similarly laid out except that the string of memory cells would be coupled in parallel between the select gates.

As one of ordinary skill in the art will appreciate, subsets of cells coupled to a selected access line, e.g., 105-1, . . . , 105-N, can be programmed and/or sensed together as a group. A programming operation, e.g., a write operation, can include applying a number of program pulses, e.g., 16V-20V, to a selected access line in order to increase the threshold voltage (Vt) of selected cells to a desired program voltage level corresponding to a desired program state.

A sensing operation, such as a read or program verify operation, can include sensing a voltage and/or current change of a sense line coupled to a selected cell in order to determine the state of the selected cell. The sensing operation can involve biasing a sense line, e.g., sense line 107-1, associated with a selected memory cell at a voltage above a bias voltage for a source line, e.g., source line 123, associated with the selected memory cell. A sensing operation could alternatively include precharging the sense line 107-1 followed with discharge when a selected cell begins to conduct, and sensing the discharge.

Sensing the state of a selected cell can include applying a sensing voltage to a selected access line, while biasing the unselected cells of the string at a voltage sufficient to place the unselected cells in a conducting state independent of the threshold voltage of the unselected cells. The sense line corresponding to the selected cell being read and/or verified can be sensed to determine whether or not the selected cell conducts in response to the particular sensing voltage applied to the selected access line. For example, the state of a selected cell can be determined by the access line voltage at which the sense line current reaches a particular reference current associated with a particular state.

As one of ordinary skill in the art will appreciate, in a sensing operation performed on a selected memory cell in a NAND string, the unselected memory cells of the string are biased so as to be in a conducting state. In such a sensing operation, the data stored in the selected cell can be based on the current and/or voltage sensed on the sense line corresponding to the string. For instance, data stored in the selected cell can be based on whether the sense line current changes by a particular amount or reaches a particular level in a given time period.

When the selected cell is in a conductive state, current flows between the source line contact at one end of the string and a sense line contact at the other end of the string. As such, the current associated with sensing the selected cell is carried through each of the other cells in the string, the diffused regions between cell stacks, and the select transistors.

Figure 2A:
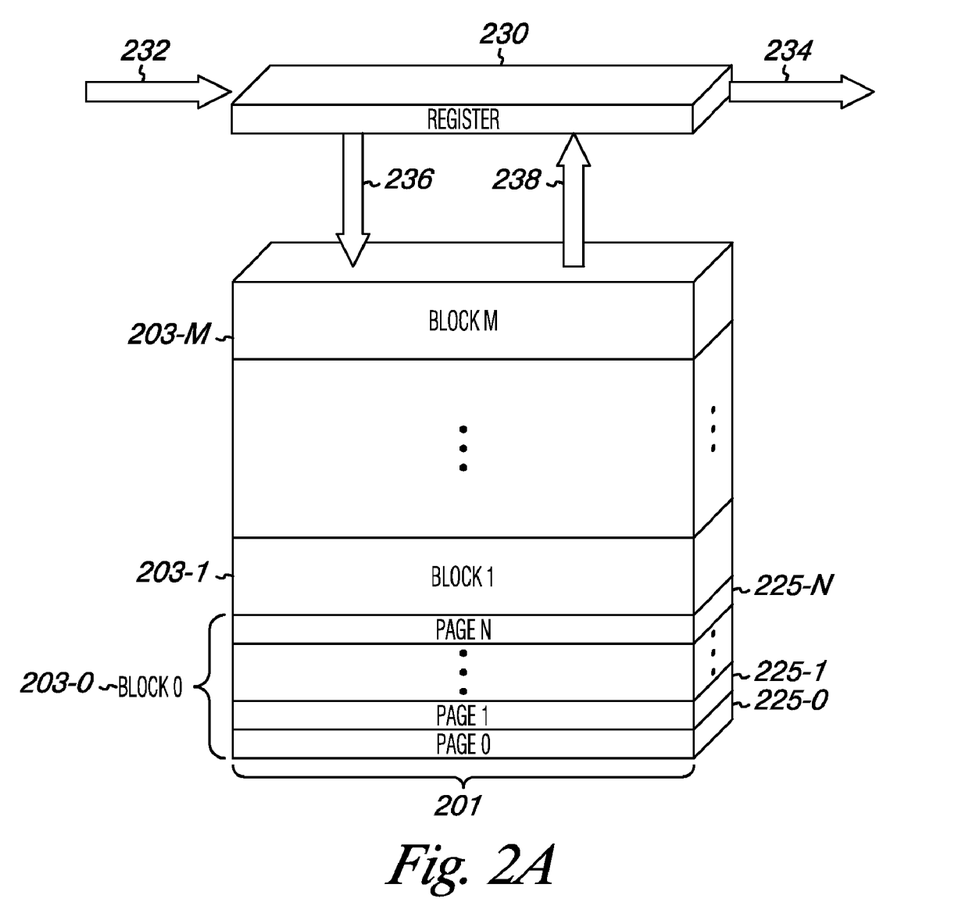
FIG. 2A illustrates a block diagram of a memory architecture in accordance with one or more embodiments of the present disclosure.

FIG. 2A illustrates a block diagram of a memory architecture in accordance with one or more embodiments of the present disclosure. The embodiment of FIG. 2A illustrates a number of pages, 225-0, 225-1, . . . , 225-N, included in Block 0, 203-0. FIG. 2A also illustrates a number of blocks 203-0, 203-1, . . . , 203-M. According to the embodiment illustrated in FIG. 2A, blocks 203-0, 203-1, . . . , 203-M together are included in plane 201.

As an example, a 2 GB memory device can include 2112 bytes of data per page, 64 pages per block, and 2048 blocks per plane. SLC devices store one bit per cell. MLC devices can store multiple bits per cell, e.g., 2 bits per cell. In a binary system, a "bit" represents one unit of data. As embodiments are not limited to a binary system, the smallest data element may be referred to herein as a "unit."

Plane 201 is shown in bidirectional communication with register 230 at 236 and 238. As one of ordinary skill in the art will appreciate, data can be transferred from register 230 to the memory plane 201 at 236 during programming operations. Data can also be transferred from the memory plane 201 to the register 230 during sensing operations. Register 230 can communicate data to input/output (I/O) circuitry, e.g., 960 in FIG. 9, at 234 and can receive data from I/O circuitry at 232. Register 230 can communicate data with I/O circuitry through a number of data cycles. By way of example, a page of data, e.g., 2 kilobytes (kB) of data, can be loaded into register 230 through a number of 1 byte data cycles. Embodiments are not limited to memory devices including a 2 kB page size. Other page sizes can be used with embodiments of the present disclosure, e.g., 4 kB, 8 kB, etc. As the reader will appreciate, a partial page of data can be communicated to and/or from register 230. According to one or more embodiments of the present disclosure, control circuitry can send a signal to selectively reset register 230 prior to communication of data to and/or from I/O circuitry, e.g., before a number of data cycles in a programming operation.

Figure 2B:
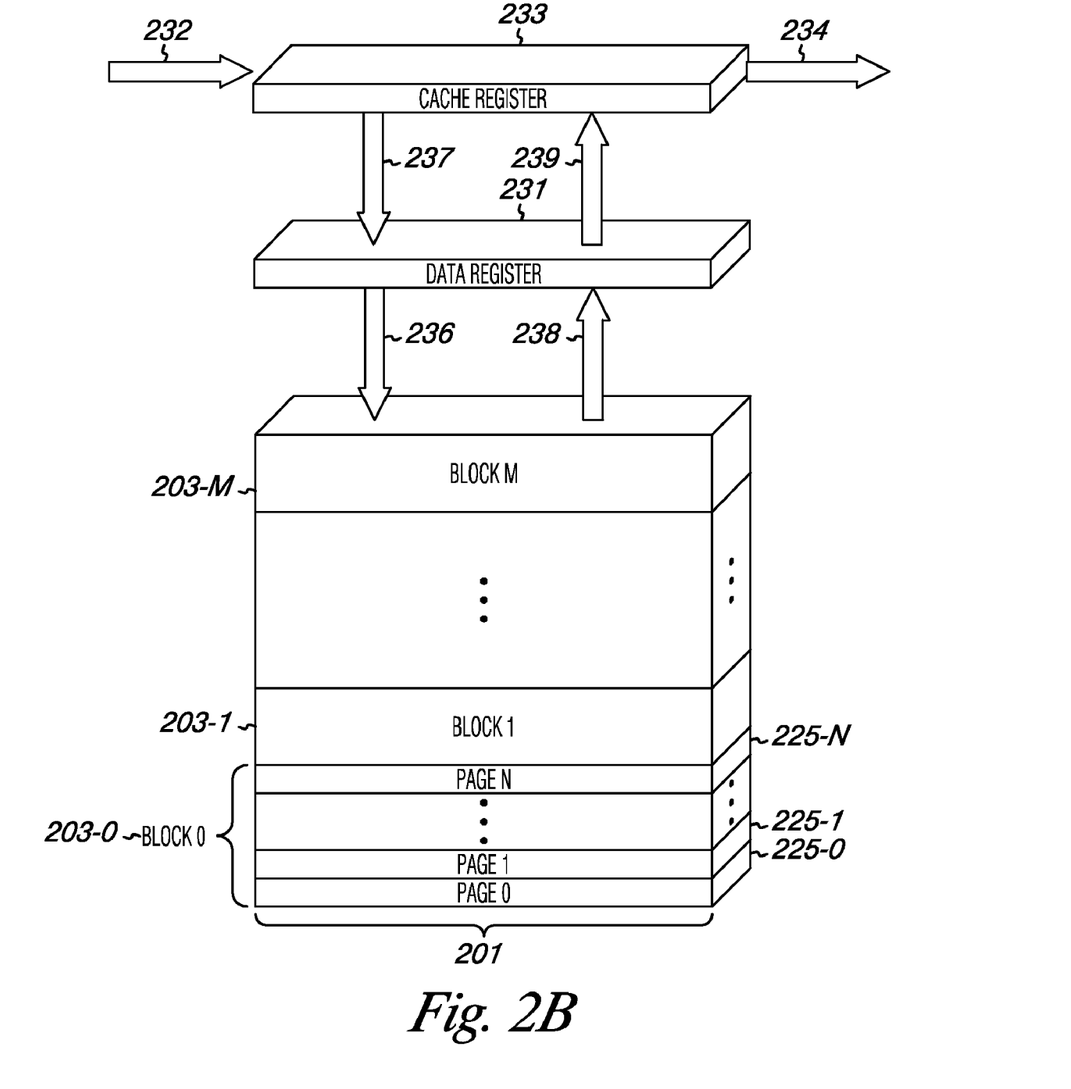
FIG. 2B illustrates a block diagram of a memory architecture in accordance with one or more embodiments of the present disclosure.

FIG. 2B illustrates a block diagram of a memory architecture in accordance with one or more embodiments of the present disclosure. Analogous to FIG. 2A, the embodiment of FIG. 2B illustrates a number of pages, e.g., Page 0, 225-0, and blocks, e.g., Block 0, 203-0, in plane 201. However, unlike FIG. 2A, the plane 201 in FIG. 2B is associated with two registers, data register 231 and cache register 233. Data register 231 can operate in an analogous fashion to register 230 in FIG. 2A in that it can transfer 236 data to memory plane 201 and receive 238 data from the memory plane 201. Cache register 233 can operate in an analogous fashion to register 230 in FIG. 2A in that it can communicate data to and/or from I/O circuitry through a number of data cycles, e.g., data input cycles 232 or data output cycles 234.

During non-cache operations, the data register 231 and cache register 233 can operate together as a single register, e.g., as register 230 in FIG. 2A. During cache operations, data register 231 and cache register 233 can operate separately in a pipelined process. For example, during a program operation, data from I/O circuitry, e.g., from a host (for instance, from a processor associated with the host), can be loaded 232 into the cache register, e.g., through a number of serially clocked data cycles, and then transferred 237 from the cache register to the data register. After data is transferred to the data register, the contents of the data register can be programmed into memory plane 201 as illustrated at 236. In an example read operation, data can be read from memory plane 201 into data register 233 as illustrated at 238. After data is loaded into data register 231, it can be transferred 239 to cache register 233. After data has been loaded into data register 231, it can be transferred 234 out to I/O circuitry.

Figure 3:
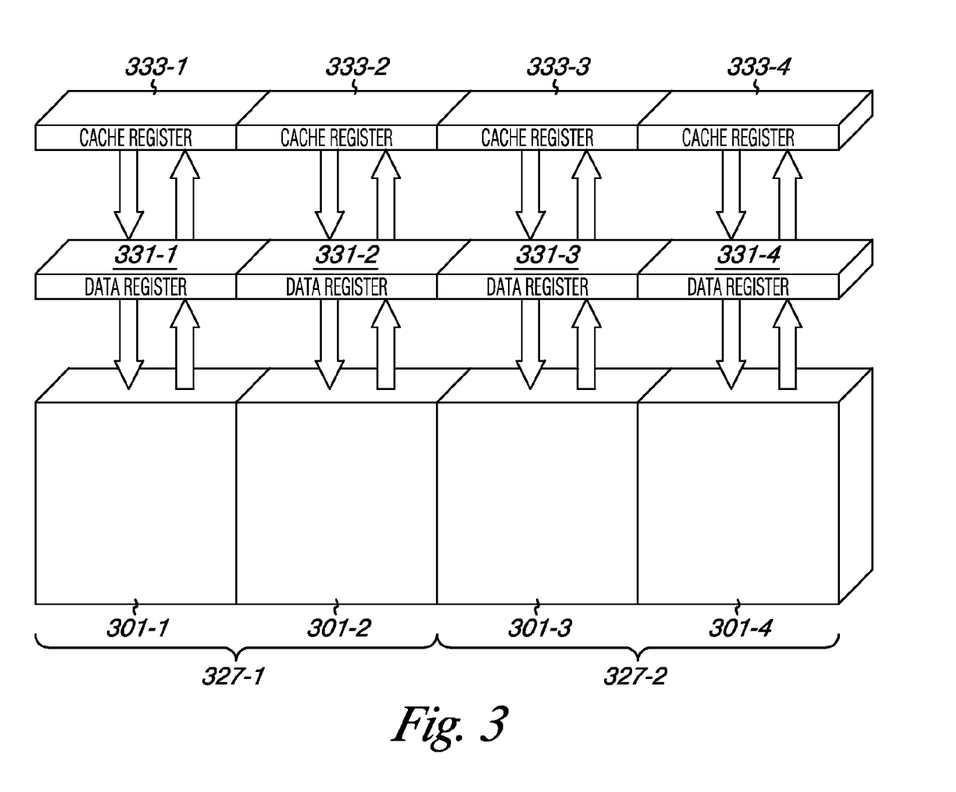
FIG. 3 illustrates a block diagram of a memory architecture in accordance with one or more embodiments of the present disclosure.

FIG. 3 illustrates a block diagram of a memory architecture in accordance with one or more embodiments of the present disclosure. FIG. 3 includes two memory dice 327-1 and 327-2 with two planes each, 301-1, 301-2, 301-3, and 301-4. Each plane is in bidirectional communication with a data register 331-1, 331-2, 331-C, and 331-4 respectively. Each data register is in bidirectional communication with a cache register 333-1, 333-2, 333-3, and 333-4 respectively. Each register can function substantially as described above with respect to FIGS. 2A and 2B.

Using a cache register for reading operations can allow pipelining a next sequential access from the array while outputting previously-accessed data. Such a double-buffered technique can allow read access time (tR) to be "hidden." Data can be first transferred from a memory array to the data register. If the cache register is available (not busy), the data can be moved from the data register to the cache register. Once the data is transferred to the cache register, the data register is available and can start to load the next sequential page from the memory array.

Using a cache register for programming operations can provide a performance improvement versus non-cached programming operations. Such a double-buffered technique can allow a controller to input data directly to the cache register and use the data register as a holding register to supply data for programming to the array. Such a method can free the cache register so that a next page operation can be loaded in parallel. In some applications, the programming time (tPROG) can be completely "hidden." The data register can maintain data through the programming cycle. Such a method can free up the cache register so that it can start receiving the next page of data from the controller.

In the embodiment illustrated in FIG. 3, plane 301-1 can represent half of the blocks on die 327-1, while plane 301-2 can represent the other half. Plane 301-3 can represent half of the blocks on die 327-2, while plane 301-4 can represent the other half. In one or more embodiments, planes can be divided between odd and even numbered blocks. In one or more embodiments, an "odd" or "even" block of data can be a logical representation of data where data units from half (the "odd" numbered) of the memory cells coupled to access lines associated with the block are stored in an "odd" block and data units from the other half (the "even" numbered) of the memory cells coupled to access lines associated with the block are stored in an "even" block. Embodiments are not limited to a particular plane representing half of the blocks on a given die having more than one plane; other distributions of blocks between planes are possible. Nor are embodiments are not limited to memory devices with a particular number of blocks, planes, or dice.

Figure 4:
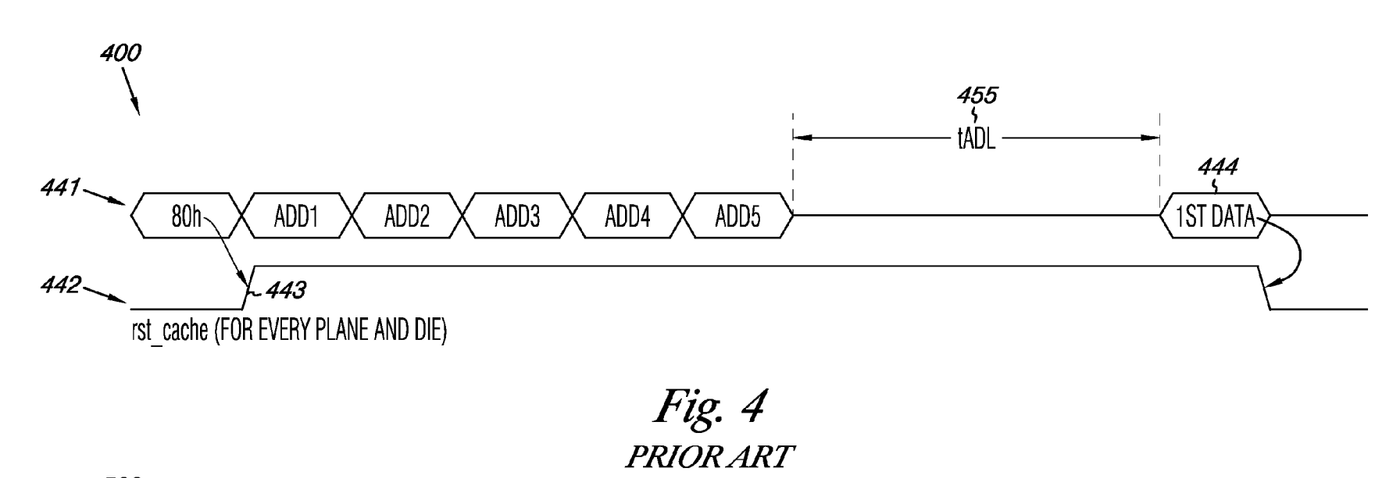
FIG. 4 illustrates a prior art timing diagram of various signals during a programming operation.

FIG. 4 illustrates a prior art timing diagram 400 of various signals during a programming operation. For example, at 441, command "80h" may be a program setup command such as a single-plane page program command for cache mode and/or non-cache mode, a multi-plane page program command for cache mode and/or non-cache mode, among other types of program setup commands. A program setup command may be followed by a number of address cycles, for example five address cycles as illustrated in FIG. 4. The number of address cycles may be followed by a number of data cycles, e.g., at least one data signal 444 to initiate a first data cycle. As described above, data cycles associated with program commands may load data into a register. For example, data may be serially clocked into the register in discrete amounts, e.g., a byte, each cycle. Address to data loading time (tADL), e.g., tADL 455 in FIG. 4, represents a delay between address cycles and data cycles. The delay between address and data loading cycles may be employed at least partially to allow sufficient time for the registers to be reset.

According to some prior art approaches, a controller may send a register reset signal 442, e.g., "rst_cache," after a program setup signal 441, e.g., 80h, is sent. The register reset signal 442 goes high at 443 to initiate resetting of registers for every plane and die. That is, according to some prior approaches, registers associated with every plane and die in the memory device, including multi-chip packages, are reset together, e.g., in response to a program setup command such as 80h. As illustrated in FIG. 4, the register reset signal 442 may go low before the data signal 444 associated with the first data cycle, indicating that the controller is no longer signaling the register reset operation, e.g., that the register reset operation has completed. In order to promote resetting of registers associated with every plane and die before initiation of data cycles, the register reset signal 432 may go high 443 right after the program setup command, e.g., 80h. Thus, according to some prior approaches, during the time in which a number of address commands (and associated address cycles) are occurring plus the delay between address cycles and data cycles, e.g., tADL 455, the registers may be reset. As illustrated in FIG. 4, it may be desirable to complete the register reset operation before the first data cycle 444 to help prevent data from being loaded into a register that has not been reset.

Figure 5:
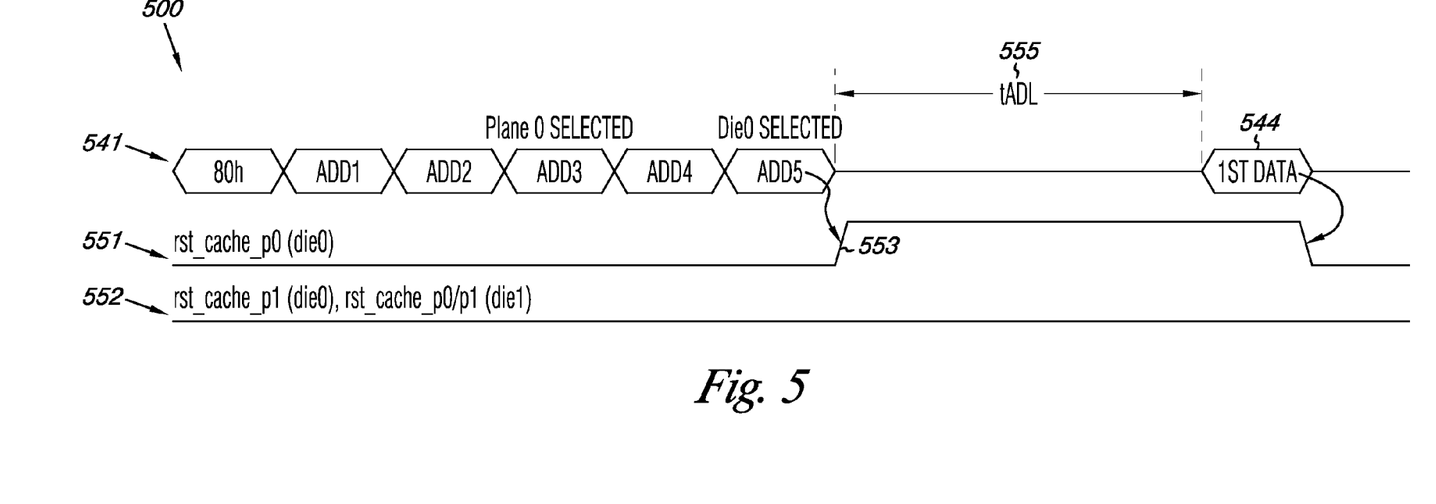
FIG. 5 illustrates a timing diagram of various signals during a programming operation in accordance with one or more embodiments of the present disclosure.

FIG. 5 illustrates a timing diagram 500 of various signals during a programming operation in accordance with one or more embodiments of the present disclosure. In contrast to some prior approaches, one or more embodiments of the present disclosure can reset a particular register while maintaining other registers. As used herein "maintaining a register" means that the register is not being reset. For example, one or more embodiments of the present disclosure can reset a particular register corresponding to a plane and die indicated by an address cycle.

Resetting a register can include "erasing" the register and/or program inhibiting the register such that it does not contain data. For example, with embodiments including binary memory devices, resetting a register can include "erasing" and/or "setting" each bit in the register such that it represents a binary data value 1, e.g., "all FFh," as will be understood by one of ordinary skill in the art. Such a resetting operation can reset the register to a state in which it is ready to receive new data. Such a resetting operation may be beneficial for memory devices that include non-volatile registers with memory elements, e.g., "cells," that can be programmed only in one direction. For example, some memory devices may include non-volatile floating gate transistors as memory elements in a register. As described above with respect to FIG. 1, such transistors can generally be erased to an erased state, e.g., a binary data value 1 in a single-level binary device, and programmed, e.g., to a binary data value 0 in a single-level binary device. Thus, if a register containing such transistors was not reset, e.g., erased, before loading new data, then non-erased data units, e.g., bits, could not be "programmed" to an erased state, e.g., a binary data value 1 in this example. Embodiments are not limited to binary data value 1 representing an erased state, nor are embodiments limited to memory devices that include non-volatile memory cell based registers.

In the case of a data load to a register of a partial page of data, e.g., a case where not all bits in the register will be programmed, resetting the register can be particularly important to help ensure that data previously programmed to the register does not become commingled with the partial page of new data. For example, if a 2 kB register was previously loaded with 2 kB of "old" data and not reset before a subsequent data load of a partial page, e.g., 1.5 kB, then after the partial page of "new" data was loaded, the remaining portion of the register would still contain "leftover" data that was previously loaded. Thus, when the "new" data is programmed to an array of memory cells, transferred to another register, or transferred to a host, the "leftover" "old" data would be programmed or transferred along with the "new" data. Such an operation could corrupt the "new" data and potentially lead to a number of errors.

Analogous to the description above, command "80h" can be a program setup command. A program setup command can be followed by a number of address cycles, for example five address cycles as illustrated in FIG. 5. Embodiments are not limited to a particular number of address cycles.

One or more address cycles associated with a programming operation can provide an indication of address information corresponding to the data to be programmed. For example, one or more address cycles can indicate a starting column address, a selected page, a selected block, and/or a selected die, among other address information. As used herein the word "starting" with respect to locations in a memory array during a programming operation means a first location to which data is to be programmed. For example, if a first data cycle will program first data to a first memory cell in column X, then column X is the "starting" column. Accordingly, second data can be programmed to a second memory cell in column X+1. In the embodiment illustrated in FIG. 5, a number of address cycles can indicate a particular plane, e.g., "Plane 0 SELECTED," and a particular die, e.g., "Die0 SELECTED" as shown above the address signals at 541, i.e., ADD1, ADD2, ADD3, ADD4, and ADD5. The location, in FIG. 5, of the selected plane and die does not imply an existing correlation with the underlying address cycle, e.g., the location of "Plane 0 SELECTED" does not necessitate a correlation with "ADD3." Embodiments of the present disclosure are not limited to a particular address cycle indicating a particular starting location type, e.g., a plane.

The number of address cycles may be followed by a number of data cycles, e.g., at least one signal to initiate a first data cycle 544. Address to data loading time (tADL), e.g., tADL 555 in FIG. 5, represents a delay between address cycles and data cycles. One or more embodiments of the present disclosure can reset a selected register during the delay between address cycles and data cycles without changing the length of the delay used by some prior memory devices, e.g., tADL 455 in FIG. 4. Accordingly, such memory devices can retain prior tADL specifications and continue to use the tADL to perform other operations as will be understood by one of ordinary skill in the art having read and understood the present disclosure.

Although not specifically illustrated in FIG. 5, a time between the issuance of a program setup command, e.g., 80h, and the initiation of a first address signal for an address cycle, e.g., ADD1, can be referred to as write cycle time "tWC." Write cycle time in modern devices has been reduced from, for example, greater than 50 nanoseconds (ns) to less than 20 ns. Furthermore, many modern devices include increased page sizes and accompanying increased register sizes, e.g. from 2 kB-4 kB-8 kB, etc. An increase in page size accompanied by a decrease in tWC can contribute to reduced ability to completely reset a register in response to issuance of a program setup command before onset of one or more data cycles. Due to demand for high speed and large volume data transfer for memory devices, increasing any of a number of delay times, e.g., tADL, to provide an increased ability to completely reset a register may not be desirable.

After an indication of a particular plane and a particular die is received, a register reset signal 551, e.g., "rst_cache_p0 (die0)," can be sent to the particular die and plane. The register reset signal 551 can go high, as indicated at 553, after completion of a number of address cycles, e.g., after ADD5. The register reset signal 551 can go low upon a signal to initiate a first data cycle 544. That is, the register indicated by one or more address cycles can be reset during tADL 555 between address cycles and data cycles. Embodiments are not limited to a register reset signal going low upon a signal to initiate a data cycle. That is, a register reset signal can go low without an associated data cycle.

While the indicated register is selectively being reset, e.g., a register associated with plane 0 and die 0 according to the embodiment illustrated in FIG. 5, other registers can be maintained. As used herein "selectively" with respect to resetting registers means that one or more registers can be reset while certain other registers are not reset. That is, a register reset signal for other registers in the device will not reset the other registers, e.g., register reset signal 552 "rst_cache_p1 (die0), rst_cache_p0/p1 (die1)," stays low. As the reader will appreciate, the example embodiment illustrated in FIG. 5 includes register reset signals for a device including two dies (die0 and die1) each having two planes (p0 and p1). Embodiments are not limited to memory devices having a particular number of dies and/or planes. Nor are embodiments limited to a particular signal convention, e.g., active low or active high.

Unless specifically noted otherwise, "resetting a register" can include resetting a data register, a cache register, some other type of register, or resetting more than one particular type of register. For example, a register reset signal could reset both a cache register and data register associated with a particular plane of memory cells, e.g., cache register 333-1 and data register 331-1 associated with plane 301-1 and die 327-1 in FIG. 3. In such an example, registers associated with other planes of memory cells can be maintained, e.g., cache registers 333-2, 333-3, and 333-4 and data registers 331-2, 331-3, and 331-4. A register reset signal can reset a cache register associated with a particular plane of memory cells while maintaining a data register associated with the plane. For example with reference to the embodiment illustrated in FIG. 3, a register reset signal could reset cache register 333-1 while data register 331-1 is maintained for plane 301-1.

Resetting registers in a memory device can involve the use of a substantial amount of current. A significant amount of noise may be associated with the use of such current to reset multiple registers in a device at one time. Accordingly, one or more embodiments of the present disclosure can serve to reduce current consumption associated with a reset operation. That is, selectively resetting one of a number of registers at a particular time can reduce current consumption and associated noise levels in a memory device.

Figure 6:
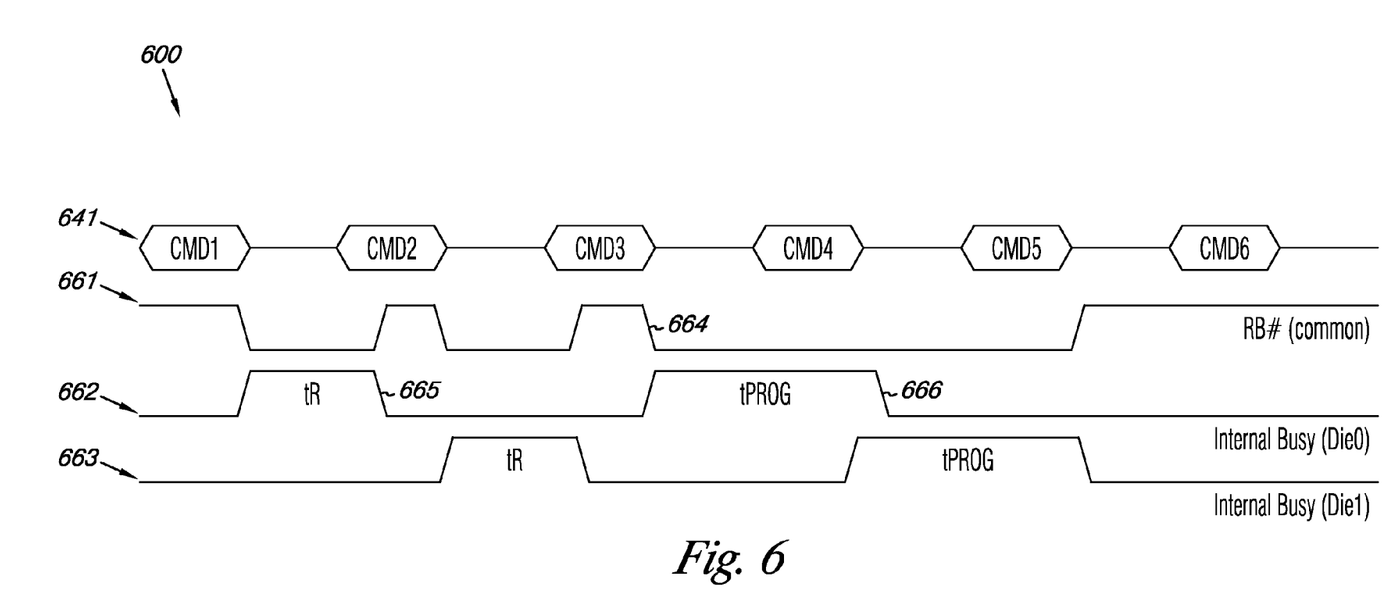
FIG. 6 illustrates a timing diagram of various signals during various operations in accordance with one or more embodiments of the present disclosure.

FIG. 6 illustrates a timing diagram 600 of various signals during various operations in accordance with one or more embodiments of the present disclosure. Various command signals are indicated at 641. For example, the various commands can be as follows for a memory device including two dice and two planes per die:

CMD1: 00h—Plane0/Die0—30h
CMD2: 00h—Plane1/Die1—30h
CMD3: 80h—Plane1/Die0—Data—10h
CMD4: 80h—Plane0/Die1—Data—10h
CMD5: 06h—Plane0/Die0—E0h—RE# toggle
CMD6: 06h—Plane1/Die1—E0h—RE# toggle Command 1 can be a page read command for Plane0/Die0 and command 2 can be a page read command for Plane1/Die1. Command 3 can be a program page command for Plane1/Die0 and command 4 can be a program page command for Plane0/Die1. Command 5 can be a random data read for Plane0/Die0 followed by a toggle of read enable. Command 6 can be a random data read for Plane1/Die1 followed by a toggle of read enable. Signals for these commands are represented for Die0 at 662 and for Die1 at 663. For example, command 1, e.g., page read, is indicated at tR 665 and command 3, e.g., program page, is indicated at tPROG 666. Signal 661 represents a common ready/busy signal for both dice. For example, signal 661 is high at 664 indicating that both dice are busy.

If registers associated with Plane1/Die0 and Plane0/Die1 are selectively reset according to one or more embodiments of the present disclosure, then a user can get correct data from registers associated with Plane0/Die0 and Plane1/Die1 with RE# toggled after CMD5 and/or CMD6. That is, the data can be preserved against register reset operations if the registers are reset selectively. According to some previous approaches, e.g., the example illustrated in FIG. 4, reset operations associated with CMD3 and CMD4 could reset all registers, thereby erasing the data stored therein. Therefore, according to some previous approaches, a user would get erased data, e.g., all FFh, from operations associated with CMD5 and CMD6.

Interleaved operations can enable separate memory planes to be operated independently, for example, so that during the loading of program data to a data register of one memory plane, program data already loaded to the data register of another memory plane is being programmed. Thus data loading and programming for different registers can be overlapped in a pipelined process to help improve memory device performance, e.g., speed.

Figure 7:
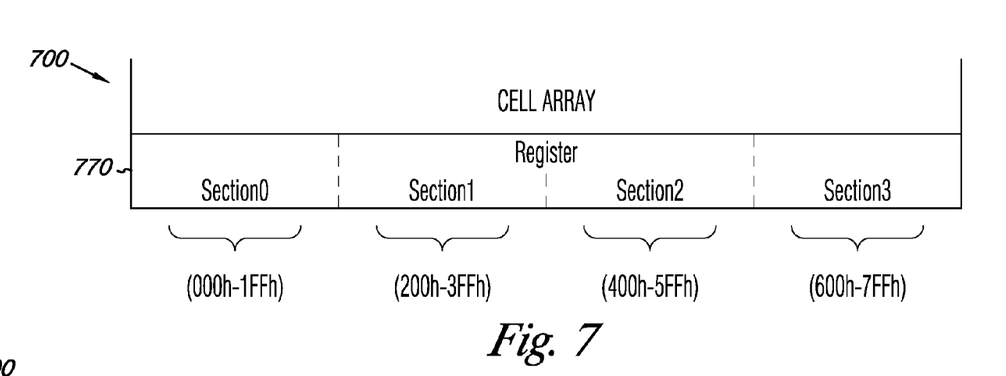
FIG. 7 illustrates a block diagram of a register architecture in accordance with one or more embodiments of the present disclosure.

FIG. 7 illustrates a block diagram 700 of a register architecture in accordance with one or more embodiments of the present disclosure. A register can be divided into sections. As used herein, dividing a register into sections" means that different sections, e.g., portions, of the register can be addressed individually, e.g., by a register reset signal, as will be described in more detail below in connection with the discussion of FIG. 8.

In the example embodiment illustrated in FIG. 7, a register can be associated with a cell array. The register can be divided into sections, e.g., Section0 770. For example, a 2 kB register with hexadecimal column addresses from 000h-7FFh can be divided into four sections with addresses: Section0 (000h-1FFh); Section1 (200h-3FFh); Section2 (400h-5FFh); and Section 3 (600h-7FFh). Embodiments are not limited to the use of a 2 kB register, or to dividing a register into four sections. Embodiments of the present disclosure can be used with other sizes of registers, other numbers of sections, and sections having different sizes, e.g., a register does not have to be divided into equal sections.

Figure 8:
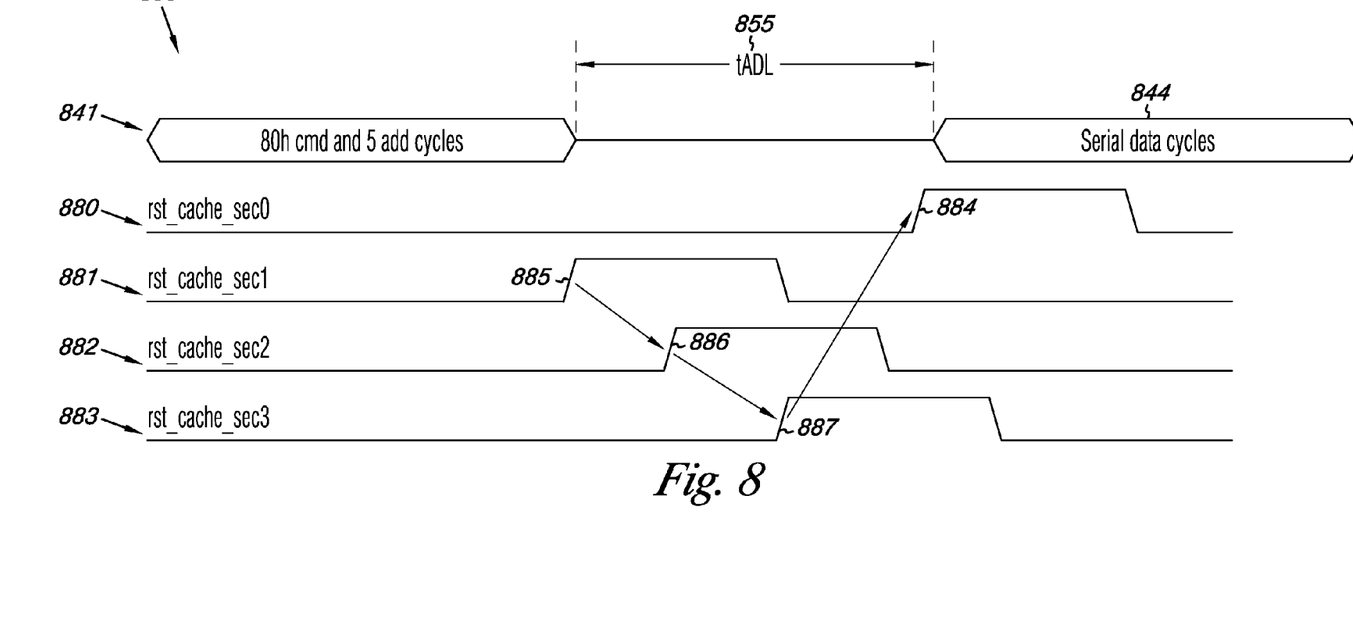
FIG. 8 illustrates a timing diagram of various signals during a programming operation in accordance with one or more embodiments of the present disclosure.

FIG. 8 illustrates a timing diagram 800 of various signals during a programming operation in accordance with one or more embodiments of the present disclosure. Command, address, and data signals are indicated at 841. As described above, command "80h" can be a program setup command. A program setup command can be followed by signals to initiate a number of address cycles, for example five address cycles as illustrated in FIG. 8. Embodiments are not limited to a particular number of address cycles. One or more address cycles associated with a programming operation can provide an indication of address information corresponding to the data to be programmed. For example, one or more address cycles can indicate a starting column address, a selected page, a selected block, and/or a selected die, among other address information. From one or more address cycles, a starting column address can be indicated. The starting column address can correspond to a column address in one of a number of sections to which a register is divided. For example, if the starting column address falls within the range 200h-3FFh, then the starting address can correspond to Section1 of the register, as illustrated in FIG. 7.

A number of register section reset signals are illustrated in FIG. 8. An example embodiment including a register divided into four sections can include a reset signal for each section, e.g., "rst_cache_sec0" 880, "rst_cache_sec1" 881, "rst_cache_sec2" 882, and "rst_cache sec3" 883. Continuing the example above, if one or more address signals and/or cycles indicate that a starting address corresponds to Section1, then a register section reset signal 881 corresponding to that section can be sent first during tADL 855 after the program setup command and address cycle signals 841 and before serial data cycle signals 844. The register section reset signal 881 for Section1 can go high 885 following a last address cycle. As only one section of a register is reset by this signal, it can take less than the full amount of tADL 855. In one or more embodiments, sections of the register other than the section indicated by the starting address can be reset sequentially after the section indicated by the staring address, e.g., Section1 in this example. Accordingly, register section reset signal 882 for Section2 can go high at 886, register section reset signal 883 for Section3 can go high at 887, and register section reset signal 880 for Section0 can go high at 884.

As indicated by the embodiment illustrated in FIG. 8, at least two sections, e.g., Section1 and Section2, of the register can be reset during tADL 855 before initiation of the data cycles 844. Such embodiments can be useful particularly when a starting column address is near an end of a register section, e.g., if the starting column address is 3FFh according to the embodiment illustrated in FIG. 7. In such instances, a first data cycle can load data into the register at the starting address, e.g., the last address in Section1. A second data cycle can load data into a sequentially next address, e.g., 400h, which, according to the present example, exists in Section2 of the register. As the reader will appreciate, it can therefore be beneficial to reset at least two sections of the register prior to initiation of a number of data cycles to help promote completion of resetting of the register sections before data is programmed thereto. As can be seen from the embodiment illustrated in FIG. 8, register section reset signals for different sections, e.g., for Section1 881 and Section2 882, can be high at the same time. That is, register section reset signals can be sent such that resetting of more than one register section can at least partially overlap. For example, signal 882 is high at 886 for a portion of the time that signal 881 is high, as illustrated in FIG. 8. Such embodiments can be useful, among other reasons, to help decrease the amount of time used to reset certain register sections.

In one or more embodiments, a memory device can include a number of planes of memory cells, where each plane includes one or more registers. Embodiments are not limited to any particular number of registers being divided into sections. That is, in one or more embodiments, some registers can be divided into sections, while other registers are not. In one or more embodiments, a memory device may include registers that are all divided into sections. For embodiments including one or more registers divided into sections, those registers can be reset either on a section-by-section basis, e.g., each section can be reset by a separate register section reset signal, or those registers may be reset on a register-by-register basis, e.g., a register can be reset as a whole.

Resetting registers in a memory device can involve the use of a substantial amount of current and an associated amount of noise. Accordingly, one or more embodiments of the present disclosure can serve to reduce current consumption associated with a reset operation. That is, selectively resetting one of a number of sections in a register at a particular time can reduce current consumption and associated noise levels in a memory device. Furthermore, resetting a register on a section-by-section basis can reduce a local peak in current consumption and noise.

Figure 9:
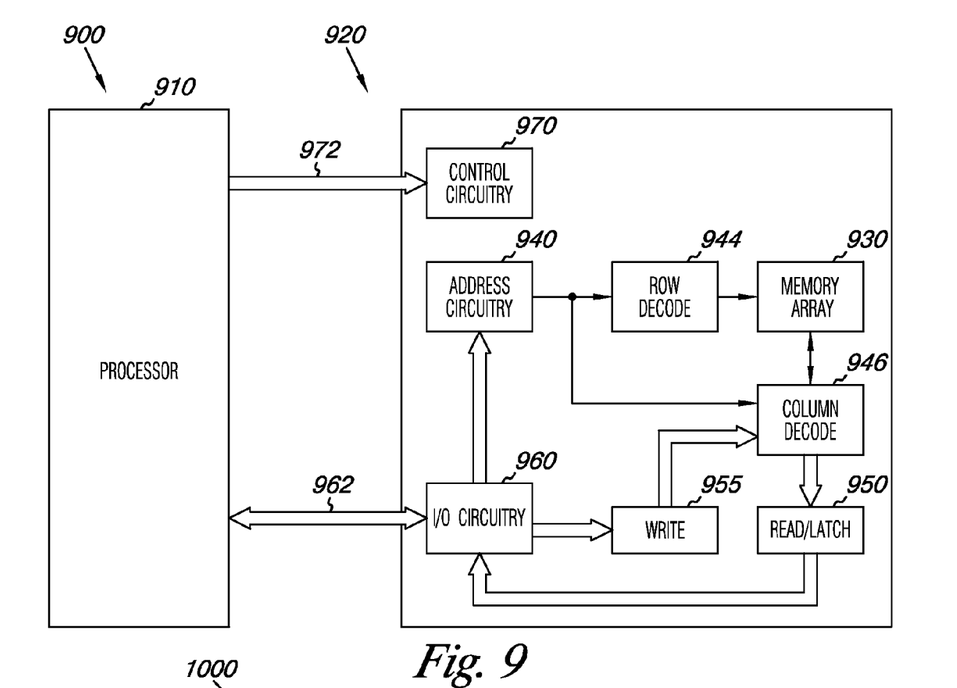
FIG. 9 is a functional block diagram of an electronic memory system having at least one memory device operated in accordance with one or more embodiments of the present disclosure.

FIG. 9 is a functional block diagram of an electronic memory system 900 having at least one memory device 920 operated in accordance with one or more embodiments of the present disclosure. Memory system 900 includes a processor 910 coupled to a non-volatile memory device 920 that includes a memory array 930 of non-volatile cells. The memory system 900 can include separate integrated circuits or both the processor 910 and the memory device 920 can be on the same integrated circuit. The processor 910 can be a microprocessor or some other type of controlling circuitry such as an application-specific integrated circuit (ASIC).

The memory device 920 includes an array of non-volatile memory cells 930, which can be floating gate flash memory cells with a NAND architecture. The control gates of memory cells of a "row" are coupled with an access line, while the drain regions of the memory cells of a "column" are coupled to sense lines. The source regions of the memory cells are coupled to source lines, as the same has been illustrated in FIG. 1. As will be appreciated by those of ordinary skill in the art, the manner of connection of the memory cells to the sense lines and source lines depends on whether the array is a NAND architecture, a NOR architecture, and AND architecture, or some other memory array architecture.

The embodiment of FIG. 9 includes address circuitry 940 to latch address signals provided over I/O connections 962 through I/O circuitry 960. Address signals are received and decoded by a row decoder 944 and a column decoder 946 to access the memory array 930. In light of the present disclosure, it will be appreciated by those skilled in the art that the number of address input connections depends on the density and architecture of the memory array 930 and that the number of addresses increases with both increased numbers of memory cells and increased numbers of memory blocks and arrays.

The memory device 920 senses data in the memory array 930 by sensing voltage and/or current changes in the memory array columns using sense/buffer circuitry that in this embodiment can be read/latch circuitry 950. The read/latch circuitry 950 can read and latch a page, e.g., a row, of data from the memory array 930. I/O circuitry 960 is included for bi-directional data communication over the I/O connections 962 with the processor 910. Write circuitry 955 is included to write data to the memory array 930.

Control circuitry 970 decodes signals provided by control connections 972 from the processor 910. These signals can include chip signals, write enable signals, and address latch signals that are used to control the operations on the memory array 930, including data sensing, data write, and data erase operations. The control circuitry 970 can selectively reset particular registers and/or sections of registers according to one or more embodiments of the present disclosure. In one or more embodiments, the control circuitry 970 is responsible for executing instructions from the processor 910 to perform the operations according to embodiments of the present disclosure. The control circuitry 970 can be a state machine, a sequencer, or some other type of controller. It will be appreciated by those skilled in the art that additional circuitry and control signals can be provided, and that the memory device detail of FIG. 9 has been reduced to facilitate ease of illustration.

Figure 10:
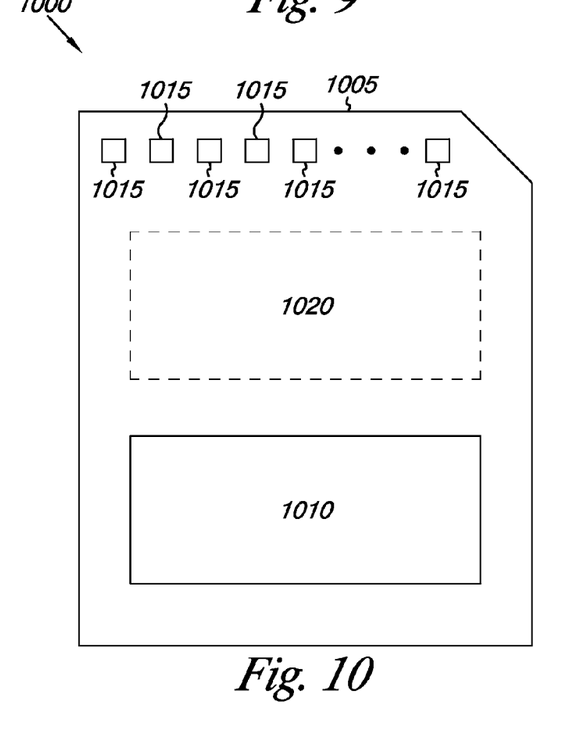
FIG. 10 is a functional block diagram of a memory module having at least one memory device in accordance with one or more embodiments of the present disclosure.

FIG. 10 is a functional block diagram of a memory module having at least one memory device operated in accordance with one or more embodiments of the present disclosure. Memory module 1000 is illustrated as a memory card, although the concepts discussed with reference to memory module 1000 are applicable to other types of removable or portable memory (e.g., USB flash drives) and are intended to be within the scope of "memory module" as used herein. In addition, although one example form factor is depicted in FIG. 10, these concepts are applicable to other form factors as well.

In one or more embodiments, memory module 1000 will include a housing 1005 (as depicted) to enclose one or more memory devices 1010, though such a housing is not essential to all devices or device applications. At least one memory device 1010 includes an array of non-volatile multilevel memory cells that can be sensed according to embodiments described herein. Where present, the housing 1005 includes one or more contacts 1015 for communication with a host device. Examples of host devices include digital cameras, digital recording and playback devices, PDAs, personal computers, memory card readers, interface hubs and the like. For one or more embodiments, the contacts 1015 are in the form of a standardized interface. For example, with a USB flash drive, the contacts 1015 might be in the form of a USB Type-A male connector. For one or more embodiments, the contacts 1015 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 1015 provide an interface for passing control, address and/or data signals between the memory module 1000 and a host having compatible receptors for the contacts 1015.

The memory module 1000 may optionally include additional circuitry 1020, which may be one or more integrated circuits and/or discrete components. For one or more embodiments, the additional circuitry 1020 may include control circuitry, such as a memory controller, for controlling access across multiple memory devices 1010 and/or for providing a translation layer between an external host and a memory device 1010. For example, there may not be a one-to-one correspondence between the number of contacts 1015 and a number of 1010 connections to the one or more memory devices 1010. Thus, a memory controller could selectively couple an I/O connection (not shown in FIG. 10) of a memory device 1010 to receive the appropriate signal at the appropriate I/O connection at the appropriate time or to provide the appropriate signal at the appropriate contact 1015 at the appropriate time. Similarly, the communication protocol between a host and the memory module 1000 may be different than what is required for access of a memory device 1010. A memory controller could then translate the command sequences received from a host into the appropriate command sequences to achieve the desired access to the memory device 1010. Such translation may further include changes in signal voltage levels in addition to command sequences.

The additional circuitry 1020 may further include functionality unrelated to control of a memory device 1010 such as logic functions as might be performed by an ASIC. Also, the additional circuitry 1020 may include circuitry to restrict read or write access to the memory module 1000, such as password protection, biometrics or the like. The additional circuitry 1020 may include circuitry to indicate a status of the memory module 1000. For example, the additional circuitry 1020 may include functionality to determine whether power is being supplied to the memory module 1000 and whether the memory module 1000 is currently being accessed, and to display an indication of its status, such as a solid light while powered and a flashing light while being accessed. The additional circuitry 1020 may further include passive devices, such as decoupling capacitors to help regulate power requirements within the memory module 1000.

Conclusion

The present disclosure includes methods, devices, modules, and systems for selective register reset. One method embodiment includes receiving an indication of a die and a plane associated with at least one address cycle. Such a method also includes selectively resetting a particular register of a number of registers, the particular register corresponding to the plane and the die.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory device, comprising:
   receiving an indication of a die and a plane associated with at least one address cycle; and
   selectively resetting a particular register of a number of registers, the particular register corresponding to the plane and the die.

2. The method of claim 1, wherein resetting the particular register includes resetting a cache register in a non-volatile memory device that includes two or more dice and two or more planes per die.

3. The method of claim 1, wherein receiving the indication includes:
   receiving the indication of the die and the plane from at least one address cycle associated with a programming operation; and wherein the method further includes:
   maintaining the number of registers other than the particular register.

4. The method of claim 1, including loading data into the particular register after selectively resetting the particular register.

5. The method of claim 1, including selectively resetting the particular register during address to data loading time (tADL) of a program operation.

6. The method of claim 1, including receiving the indication of the die and the plane as a starting column address from the at least one address cycle.

7. A method for an interleaving operation of a memory device, comprising in order:
   loading at least a partial first page of data from a first plane to at least one section of a first register;
   selectively resetting at least one section of a second register;
   loading at least a partial second page of data from I/O circuitry to the at least one section of the second register; and
   reading at least the partial first page of data from the at least one section of the first register.

8. A method for operating a memory device, comprising:
   receiving a starting address associated with at least one address cycle, wherein the starting address corresponds to a particular section of the register; and
   selectively resetting the particular section of the register.

9. The method of claim 8, including resetting the particular section and at least one other section of the register between address cycles and data cycles.

10. The method of claim 9, including:
initiating resetting of the particular section at a first time; and
initiating resetting of the at least one other section at a second time that is later than the first time such that resetting the particular section and resetting the at least one other section at least partially overlap.

11. The method of claim 9, including resetting sections other than the particular section and the at least one other section after at least a first data cycle.

12. The method of claim 8, including:
resetting the particular section of the register according to a reset signal at a first time; and
resetting other sections of the register according to other reset signals at times different than the first time.

13. The method of claim 12, including resetting the two or more sections of the register sequentially, beginning with the particular section.

14. A memory device, comprising:
a first plane of memory cells associated with a first register;
a second plane of memory cells associated with a second register; and
control circuitry coupled to the first and the second planes and configured to selectively send a reset signal to the first register without sending a reset signal to the second register.

15. The memory device of claim 14, wherein the control circuitry is configured to selectively send a reset signal to the second register without sending a reset signal to the first register.

16. The memory device of claim 14, wherein the control circuitry is configured to issue a program setup command that initiates a sequence including, in order:
one or more address cycles;
selective reset of the first register; and
one or more data cycles to load data into the first register.

17. The memory device of claim 14, wherein the control circuitry is configured to selectively send the reset signal to the first register according to information received from one or more address cycles.

18. The memory device of claim 14, wherein:
the device includes one or more dice;
the first plane and the second plane are associated with one of the one or more dice;
the device includes more than two planes and more than one register per plane; and
the first register is a cache register.

19. A memory device, comprising:
one or more planes of memory cells associated with one or more registers;
the one or more registers divided into two or more sections; and
control circuitry coupled to the one or more planes and configured to selectively send reset signals to at least one of the one or more registers on a section-by-section basis.

20. The memory device of claim 19, wherein each of the one or more planes is associated with different registers.

21. The memory device of claim 19, wherein:
the control circuitry is configured to receive starting column address information from one or more address cycles; and
wherein the starting column address information corresponds to a first section of the at least one register.

22. The memory device of claim 21, wherein the control circuitry is configured to sequentially send reset signals to the two or more sections of the at least one register, beginning with the first section.

23. The memory device of claim 19, wherein:
the one or more registers are divided into three or more sections; and
the control circuitry is configured to send reset signals to at least two of the three or more sections of the at least one register such that the at least two sections initiate and complete a reset operation between address cycles and data cycles.

24. The memory device of claim 19, wherein:
the device includes one or more dice;
at least one of the one or more planes is associated with at least one of the one or more dice;
the control circuitry is configured to receive starting column address information from one or more address cycles;
wherein the starting column address information corresponds to a particular die, a particular plane, and a particular section of a particular register; and
wherein the particular register is associated with the particular plane and the particular die.

25. The memory device of claim 24, wherein the control circuitry is configured to sequentially send reset signals to the particular register beginning with the particular section.

* * * * *